(12) United States Patent
Manasse

(10) Patent No.: US 7,581,156 B2
(45) Date of Patent: Aug. 25, 2009

(54) SYSTEMS AND METHODS FOR PROVIDING IMPROVED ENCODING AND RECONSTRUCTION OF DATA

(75) Inventor: Mark Steven Manasse, San Francisco, CA (US)

(73) Assignee: MIcrosoft Corporation, Redmond, WA (US)

( * ) Notice: Subject to any disclaimer, the term of this patent is extended or adjusted under 35 U.S.C. 154(b) by 1179 days.

(21) Appl. No.: 10/321,159

(22) Filed: Dec. 16, 2002

(65) Prior Publication Data

US 2004/0117718 A1 Jun. 17, 2004

(51) Int. Cl.
*H03M 13/00* (2006.01)

(52) U.S. Cl. ..................................... 714/781; 714/786

(58) Field of Classification Search .................. 714/781, 714/786
See application file for complete search history.

(56) References Cited

U.S. PATENT DOCUMENTS

| | | | |
|---|---|---|---|
| 5,452,310 A * | 9/1995 | Arts ........................... | 714/781 |
| 5,946,328 A | 8/1999 | Cox et al. ................. | 371/37.11 |
| 6,026,507 A | 2/2000 | Tamura ...................... | 714/786 |
| 6,192,472 B1 | 2/2001 | Garay et al. ................ | 713/165 |
| 6,275,965 B1 | 8/2001 | Cox et al. ................... | 714/755 |
| 6,282,619 B1 | 8/2001 | Islam et al. ................. | 711/165 |
| 6,282,670 B1 | 8/2001 | Rezaul Islam et al. ......... | 714/6 |
| 6,282,671 B1 | 8/2001 | Islam et al. .................... | 714/6 |
| 6,378,104 B1 * | 4/2002 | Okita .......................... | 714/784 |
| 6,421,807 B1 | 7/2002 | Nakamura et al. .......... | 714/781 |
| 6,487,692 B1 * | 11/2002 | Morelos-Zaragoza ....... | 714/784 |
| 6,550,035 B1 * | 4/2003 | Okita .......................... | 714/774 |
| 6,654,926 B1 * | 11/2003 | Raphaeli et al. ............. | 714/780 |

OTHER PUBLICATIONS

Alvarez, G.A. et al., "Tolerating Multiple Failures in RAID Architectures with Optimal Storage and Uniform Declustering," *ACM Sigarch Computer Architecture News*, 1997, 25(2), 11 pages.

Chen, T.-C., et al., "Step-by-Step Decoding Algorithm for Reed-Solomon Codes," *IEEE Proceedings-Communications*, 2000, 147(1), 8-12.

Djigan, V. et al., "Specifics of Checking Matrix Applications for Determination of the Reed-Solomon Codes Checking Symbols," *Automatic Control and Computer Sciences*, 1993, 27(4), 51-60.

Du Wei-Zhang, et al., "The Form of Generator Matrices of Maximum Rank Distance Reed-Solomon Codes," *J. of Xidian University*, 2000, 27(3), 355-357 (English language abstract included).

Joiner, L.L. et al., "Soft Decision Decoding of Reed-Solomon Codes Using the Extended Erasure Magnitude Matrix," *MILCOM 2000 Proceedings: 21st Century Military Communications. Architectures and Technologies for Information Superiority*, Los Angeles, California, Oct. 22-25, 2000, vol. 1, 392-396.

(Continued)

*Primary Examiner*—Esaw T Abraham
(74) *Attorney, Agent, or Firm*—Woodcock Washburn LLP

(57) ABSTRACT

Systems and methods for constructing Reed-Solomon encoding matrices are provided that are simpler and more regular than existing techniques, and which allow for the coding to be applied to more data disks than previous techniques. More particularly, systems and methods for simplifying the construction of Reed-Solomon based erasure codes, or coding matrices, over $GF(2^n)$ in connection with circumstances wherein the number of errors to be corrected is less than or equal to three are provided.

12 Claims, 6 Drawing Sheets

OTHER PUBLICATIONS

Kim, S.W. et al., "Performance Limits of Reed-Solomon Coded CDMA with Orthogonal Signaling in a Rayleigh-Fading Channel," *IEEE Trans. on Communications*, 1998, 46(9), 1125-1134.

Litwin, W. et al., "LH*$_{RS}$: A High-Availability Scalable Distributed Data Structure Using Reed Solomon Codes," *Proceedings of the 2000 ACM SIGMOD Int'l Conference on Management of Data*, 2000, 19 pages.

Neifeld, M.A. et al., "Error-Correction Schemes for Volume Optical Memories," *Applied Optics*, 1995, 34(35), 8183-8191.

Neifeld, M.A., "Mulitple-Error-Correcting Codes for Improving the Performance of Optical Matrix-Vector Processors," *Optics Letters*, 1995, 20(7), 758-760.

Paar, C., "Optimized Arithmetic for Reed-Solomon Encoders," *Proceedings of IEEE International Symposium on Information Theory*, Jun. 29-Jul. 4, 1997, 250.

Roth, R.M. et al., "On MDS Codes Via Cauchy Matrices," *IEEE Trans. on Information Theory*, 1989, 35(6), 1314-1319.

Seroussi, G., "A Systolic Reed-Solomon Encoder," *IEEE Trans. on Information Theory*, 1991, 37(4), 1217-1220.

Sheetalkumar, M.R. et al., "On The Dimension of SSRS Codes," *Proceedings: 2001 IEEE International Symposium on Information Theory*, Washington, DC, Jun. 24-29, 2001, 178.

Vardy, A. et al., "Bit-Level Soft-Decision Decoding of Reed-Solomon Codes," *IEEE Trans. on Communications*, 1991, 39(3), 440-444.

Wolf, J.K., "ECC Performance of Interleaved RS Codes with Burst Errors," *IEEE Trans. on Magnetics*, 1998, 34(1), 75-79.

Zongwang, Li et al., "A Simple Interative Soft Decoding Algorithm for Reed-Solomon Product Codes," *Vehicular Technology Conference, IEEE 55$^{th}$ Vehicular Technology Conference*, Birmingham, Alabama, May 6-9, 2002, vol. 3, 1555-1558.

* cited by examiner

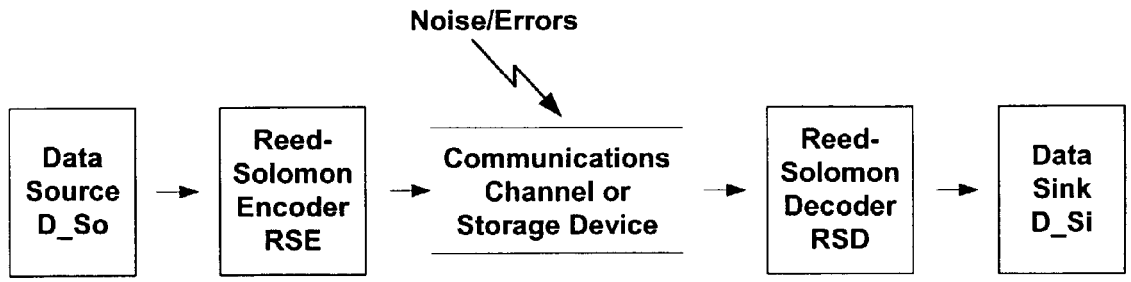
FIG. 1A - Prior Art
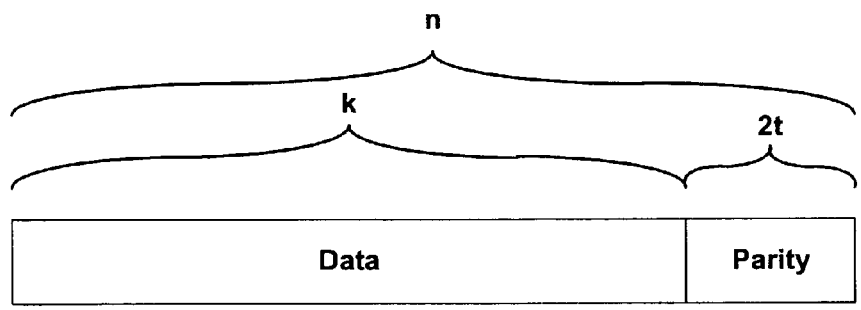
FIG. 1B - Prior Art

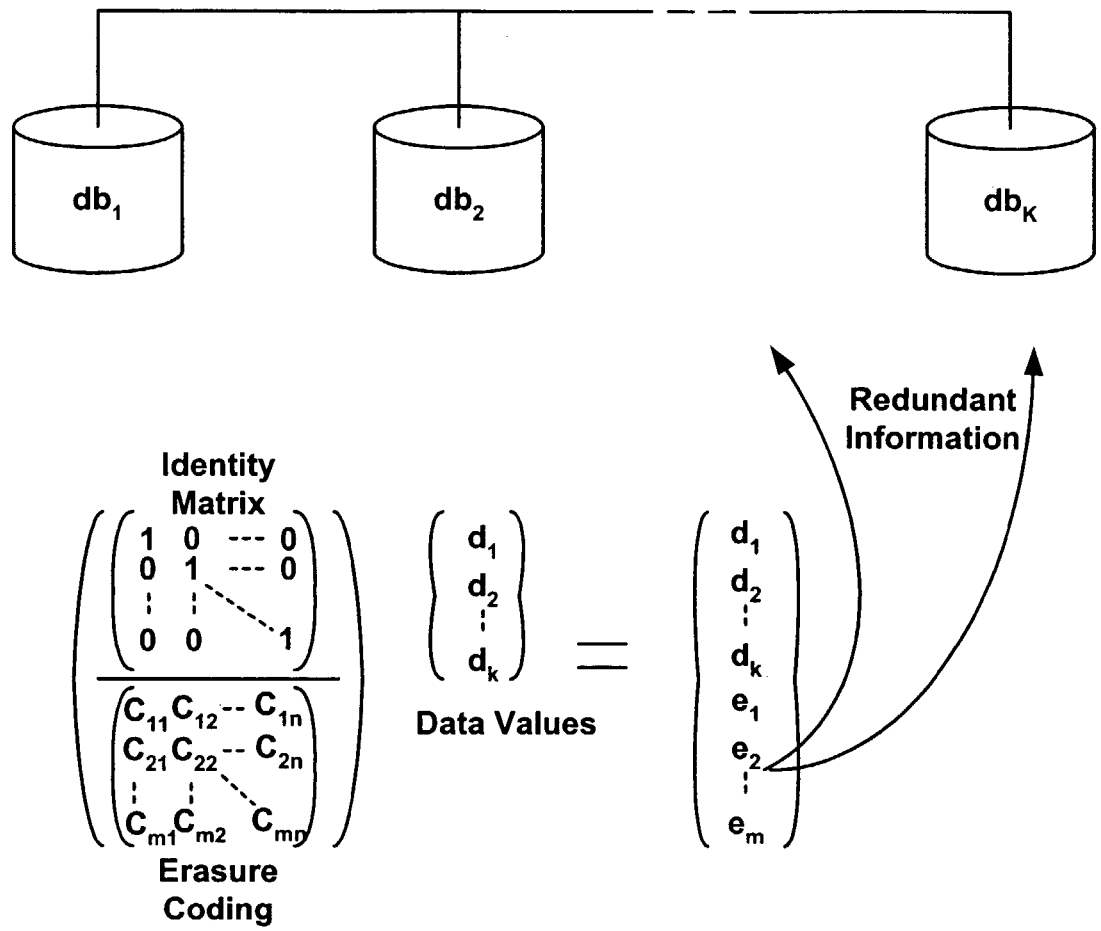
Equation 1: $A \vec{V} = \vec{e}$
FIG. 1C - Prior Art

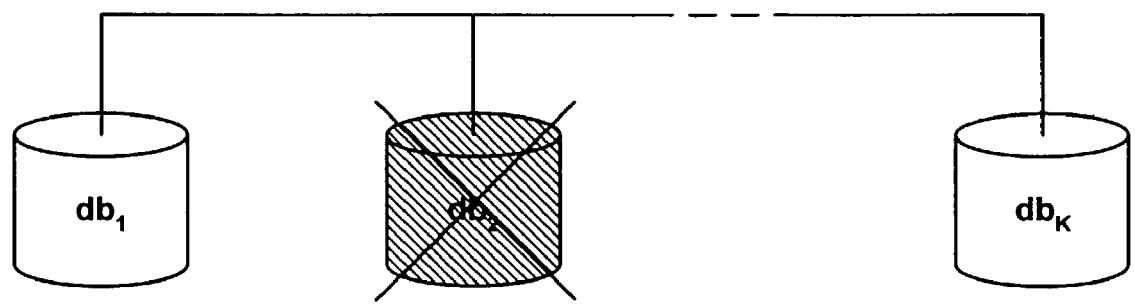
Equation 2: $\hat{A}\vec{V} = \hat{\vec{e}}$
Equation 3: $\vec{V} = \hat{A}^{-1}\hat{\vec{e}}$
FIG. 1D - Prior Art

Identity Matrix

$$\left( \begin{array}{c} \begin{pmatrix} 1 & 0 & 0 & \cdots & 0 \\ 0 & 1 & 0 & \cdots & 0 \\ 0 & 0 & 1 & \cdots & 0 \\ \vdots & \vdots & \vdots & & \\ 0 & 0 & 0 & & 1 \end{pmatrix} \\ \hline \begin{pmatrix} 1 & 1 & 1 & \cdots & 1 \\ 1 & x & x^2 & \cdots & x^k \\ 1 & x^2 & x^4 & \cdots & x^{2k} \end{pmatrix} \end{array} \right)$$

Erasure Coding for Restricted Case

FIG. 3

$\alpha = x^j$

Log Table

| | |
|---|---|
| 0 | -255 |
| 1 | 0 |
| 2 | 1 |
| 3 | 25 |
| ⋮ | ⋮ |
| 255 | 175 |

$2^l$ elements

Antilog Table

| | |
|---|---|
| -510 | 0 |
| ⋮ | ⋮ |
| -1 | 0 |
| 0 | 1 |
| 1 | 2 |
| 2 | 4 |
| ⋮ | ⋮ |
| 254 | 142 |
| ⋮ | ⋮ |

FIG. 4

SYSTEMS AND METHODS FOR PROVIDING IMPROVED ENCODING AND RECONSTRUCTION OF DATA

COPYRIGHT NOTICE AND PERMISSION

A portion of the disclosure of this patent document may contain material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice shall apply to this document: Copyright© 2002, Microsoft Corp.

FIELD OF THE INVENTION

The present invention is directed to systems and methods for providing improved encoding and reconstruction of data. More particularly, the present invention is directed to systems and methods for providing improved use and generation of Reed-Solomon erasure codes.

BACKGROUND

When digital data is transmitted or stored, it is common to be concerned with both errors and erasures. An error occurs in a data stream when some data element is corrupted. An erasure occurs when a data element is missing or known to be faulty. Shannon's coding theorems state (i) that a data stream needs to guarantee a minimum distance between correct streams of at least 2e+1 to correct e errors and (ii) that the streams need minimum distance e to detect e errors, or to correct e erasures. Erasure codes are used in many applications to efficiently protect data when stored or transmitted.

In more practical settings, the transmission or storage of data is generally grouped into bytes and thus, erasures or errors are expected to take place in multiples of bytes. To this end, Reed and Solomon devised a method for constructing linear erasure codes over finite fields, where the individual data items can be represented as elements of the finite field. For digital data, it is convenient to consider the fields $GF(2^n)$, e.g., for n=8, 16 or 32. If it is desirable to correct e erasures from m data words (where $m+e<=1+2^n$), m+e result words can be computed as the result of multiplying the length-m vector of the data words by an m by m+e coding matrix. An important observation was made that by using a Vandermonde matrix having the property that any m by m submatrix is invertible, the missing data elements can be reconstructed from any m of the m+e result words.

If erasures are uncommon, the data can be more quickly recovered by diagonalizing the coding matrix, so that the initial m by m submatrix is the identity matrix, i.e., the matrix with the field element 1 on the main diagonal and the element 0 everywhere else. In this case, the first m result words are identical to the data words, simplifying both encoding and decoding in the common case.

In the standard construction, the largest Vandermonde matrix that can be constructed over $GF(2^n)$ has $2^n$ columns. In addition, one extra non-Vandermonde column can be added to a Vandermonde matrix while preserving the invertibility property. Such a matrix, when diagonalized, gives rise to the bounds described above, although the e columns corresponding to the correction coding have no particularly elegant or convenient mathematical properties. As such, the elements of the coding must be stored in a coding matrix, and consulted on every coding step.

While Reed-Solomon based erasure codes have been used for many years because they are computationally convenient, due to recent proliferation of data of all types, such as email, images, movies, software, etc., being stored across storage media, which data is often stored remotely from the computer providing access to the data, and due to the corresponding exponential increase in amounts of data being stored, there is a persisting need for further efficiency and greater simplification in the use of Reed-Solomon based erasure codes. For instance, for email providing services, such as HOTMAIL®, a reduction of just a small percentage of processing results in vast savings in terms of the cost and size of back end computing resources that are required to achieve the objective.

In more detail, Reed-Solomon codes are used to correct erasures and errors in many systems including: storage devices such as tape, Compact Disk (CD), Digital Versatile Disk (DVD), barcodes, etc., wireless or mobile communications such as cellular telephones, microwave links, etc., satellite communications, digital television such as Digital Video Broadcasting, and high-speed modems such as Asymmetric Digital Subscriber Line (ADSL), other variations of DSL (xDSL), etc.

A typical system utilizing Reed-Solomon codes is illustrated in FIG. 1A. The Reed-Solomon encoder RSE takes a block of digital data from data source D_So (any data source) and adds extra "redundant" bits. When erasures or errors occur during transmission or storage, which can happen for a number of different reasons, e.g., noise or interference, scratches on a CD, missing data, etc., the Reed-Solomon decoder RSD processes each block and attempts to correct the erasures or errors and recover the original data. The number and type of erasures and errors that can be corrected depend on the characteristics of the Reed-Solomon code being utilized.

Reed-Solomon codes have a number of properties. Reed-Solomon codes are a subset of Bose-Chaudhuri-Hockenghem (BCH) codes and are linear block codes. A Reed-Solomon code can be specified as RS(n, k) with s-bit symbols. This means that the encoder RSE takes k data symbols of s bits each and adds parity symbols to make an n symbol codeword. There are n-k parity symbols of s bits each. The diagram of FIG. 1B shows a typical Reed-Solomon codeword known as a Systematic code because the data is left unchanged and the parity symbols are appended.

As mentioned, Reed-Solomon algebraic decoding procedures can correct errors and erasures. An erasure occurs when the position of an erred symbol is known. A decoder can correct up to t errors or up to 2t erasures. Erasure information can often be supplied by the demodulator in a digital communication system, i.e., the demodulator "flags" symbols that are likely to contain erasures or errors.

When a codeword is decoded, there are three possible outcomes: (1) if 2s+r<2t (s errors, r erasures), then the original transmitted code word will always be recovered, (2)(a) if 2s+r>=2t, the decoder will detect that it cannot recover the original code word and indicate this fact or (2)(b) the decoder will mis-decode and recover an incorrect code word without any indication. The probability of each of the three possibilities depends on the particular Reed-Solomon code and on the number and distribution of errors.

The advantage of using Reed-Solomon codes is that the probability of an erasure or error remaining in the decoded data is usually much lower than the probability of an erasure or error if Reed-Solomon is not used. This is often described as coding gain.

Reed-Solomon encoding and decoding can be carried out in software or in special-purpose hardware. Reed-Solomon codes are based on a specialist area of mathematics known as Galois fields (GF) or finite fields. A finite field has the property that arithmetic operations (+, −, *, /, etc.) on field elements always have a result in the field. A Reed-Solomon encoder or decoder carries out these arithmetic operations, utilizing special hardware or software functions.

A Reed-Solomon codeword is generated using a special polynomial. All valid codewords are exactly divisible by the generator polynomial. The general form of the generator polynomial is:

$$g(x)=(x-\alpha^i)(x-\alpha^{i+1}) \ldots (x-\alpha^{i+2t})$$

and the codeword is constructed using:

$$c(x)=g(x) \cdot i(x)$$

where g(x) is the generator polynomial, i(x) is the information block, c(x) is a valid codeword and a is referred to as a primitive element of the field.

For example, a generator for RS(255, 249) appears as follows:

$$g(x)=(x-\alpha^0)(x-\alpha^1)(x-\alpha^2)(x-\alpha^3)(x-\alpha^4)(x-\alpha^5)$$

$$g(x)=x^6+g_5x^5+g_4x^4+g_3x^3+g_2x^2+g_1x^1+g_0$$

The overall mathematics of the use of a typical Reed-Solomon matrix to code and decode (reconstruct), in order to recover erasures, is further illustrated in FIGS. 1C and 1D. In FIG. 1C, a variety of databases $d_1$ to $d_k$ are illustrated for the storage of data, such as email. In this regard, for a given slice of data, $d_1$ to $d_k$ from databases $db_1$ to $db_k$, the data including error correction values is constructed by multiplying the identity matrix and a Reed-Solomon coding matrix by the data values to obtain the data values and corresponding error correction data for storage. Symbolically, this is represented by equation 1, wherein A is the encoding matrix, vector V represents the slice of data being encoded and vector e represents the error correction data values.

When one of the disks fails, as illustrated by the failure of $db_2$ in FIG. 1D, in accordance with Reed-Solomon recovery techniques, one can recover the data that failed by removing the row relevant to the data to be recovered from matrix A (in this case, the second row, corresponding to the second database) to provide A^, gathering the error correction data values (vector e^) from the "unfailed" databases, and performing matrix multiplication with inverted matrix $(A^{\wedge})^{-1}$, in order to recover vector V, as illustrated by equations 2 and 3.

Cauchy-based Reed Solomon matrices yield mathematically elegant matrices, but they are generally small. Cauchy-based matrices support the property that, for m data elements, k error corrections and l number of irreducible polynomial elements (e.g., 8, 16 or 32 bits), $2m+k<=2^l+1$. Vandermonde matrices support the property that $m+k<=2^l+1$. However, simpler constructions of the coding matrix are desirable. Thus, there exists a continuing need for the provision of new methods for constructing Reed-Solomon encoding matrices which is simpler and more regular than existing techniques, and which allows for the coding to be applied to more disks than previous techniques. Moreover, for practical considerations, or probabilistic reasons, it would be desirable to optimize existing techniques for the case where k<=3.

SUMMARY OF THE INVENTION

The present invention provides systems and methods for constructing Reed-Solomon encoding matrices that are simpler and more regular than those produced by existing techniques. The systems and methods of the invention enable Reed-Solomon coding to be applied to more data disks than previous techniques. More particularly, the present invention provides systems and methods for simplifying the construction of Reed-Solomon based erasure codes, or coding matrices, over GF(2^n) in connection with circumstances wherein the number of erasures to be corrected is less than or equal to three. The construction of such coding matrices in accordance of the invention may be utilized in connection with encoding and/or recovering data, and may be embodied in a data structure. The various techniques and embodiments of the invention may be implemented in software and/or hardware.

Other features and embodiments of the present invention are described below.

BRIEF DESCRIPTION OF THE DRAWINGS

The systems and methods for providing encoding and reconstructing data in accordance with the present invention are further described with reference to the accompanying drawings in which:

FIGS. 1A to 1D are diagrams illustrating conventional application of Reed-Solomon based erasure codes;

FIG. 3 is an illustration of an exemplary construction of an encoding matrix in accordance with the present invention; and FIG. 4 is an illustration of the construction of exemplary log and anti-log tables in accordance with the present invention.

DETAILED DESCRIPTION OF THE INVENTION

Overview

The present invention provides systems and methods for constructing a Reed-Solomon encoding matrix that are simpler and more regular than existing techniques, and which allow for the coding to be applied to more disks than previous techniques. More particularly, the present invention provides systems and methods for simplifying the construction of erasure codes, or coding matrix, over GF(2^n) in connection with the restricted case when e<=3. In exemplary embodiments, the construction techniques of the invention append up to three columns of a Vandermonde matrix to an identity matrix of maximum size (2^n−1) square, leading to a coding matrix supporting the property m+e<=2^n+2. Due to properties of a Vandermonde matrix, the encoding is regular, and inverse matrices are also regular. In one aspect, the systems and methods of the invention simplify encoding and decoding, allowing software implementations to be faster, and hardware implementations to be more compact. In one illustrative embodiment, the systems and methods of the invention allow one more disk than is conventional to be protected from data loss.

Exemplary Networked and Distributed Environments

One of ordinary skill in the art can appreciate that a computer or other client or server device can be deployed as part of a computer network, or in a distributed computing environment. In this regard, the present invention pertains to any computer system having any number of memory or storage units, and any number of applications and processes occurring across any number of storage units or volumes, which may be used in connection with encoding or decoding data. The present invention may apply to an environment with server computers and client computers deployed in a network environment or distributed computing environment, having remote or local storage. The present invention may also be applied to standalone computing devices, having programming language functionality, interpretation and execution capabilities for generating, receiving and transmitting information in connection with remote or local services.

Distributed computing facilitates sharing of computer resources and services by direct exchange between computing devices and systems. These resources and services include the exchange of information, cache storage, and disk storage for files. Distributed computing takes advantage of network connectivity, allowing clients to leverage their collective power to benefit the entire enterprise. In this regard, a variety of devices may have applications, objects or resources that may implicate the encoding/decoding techniques of the invention.

Figure 2A:
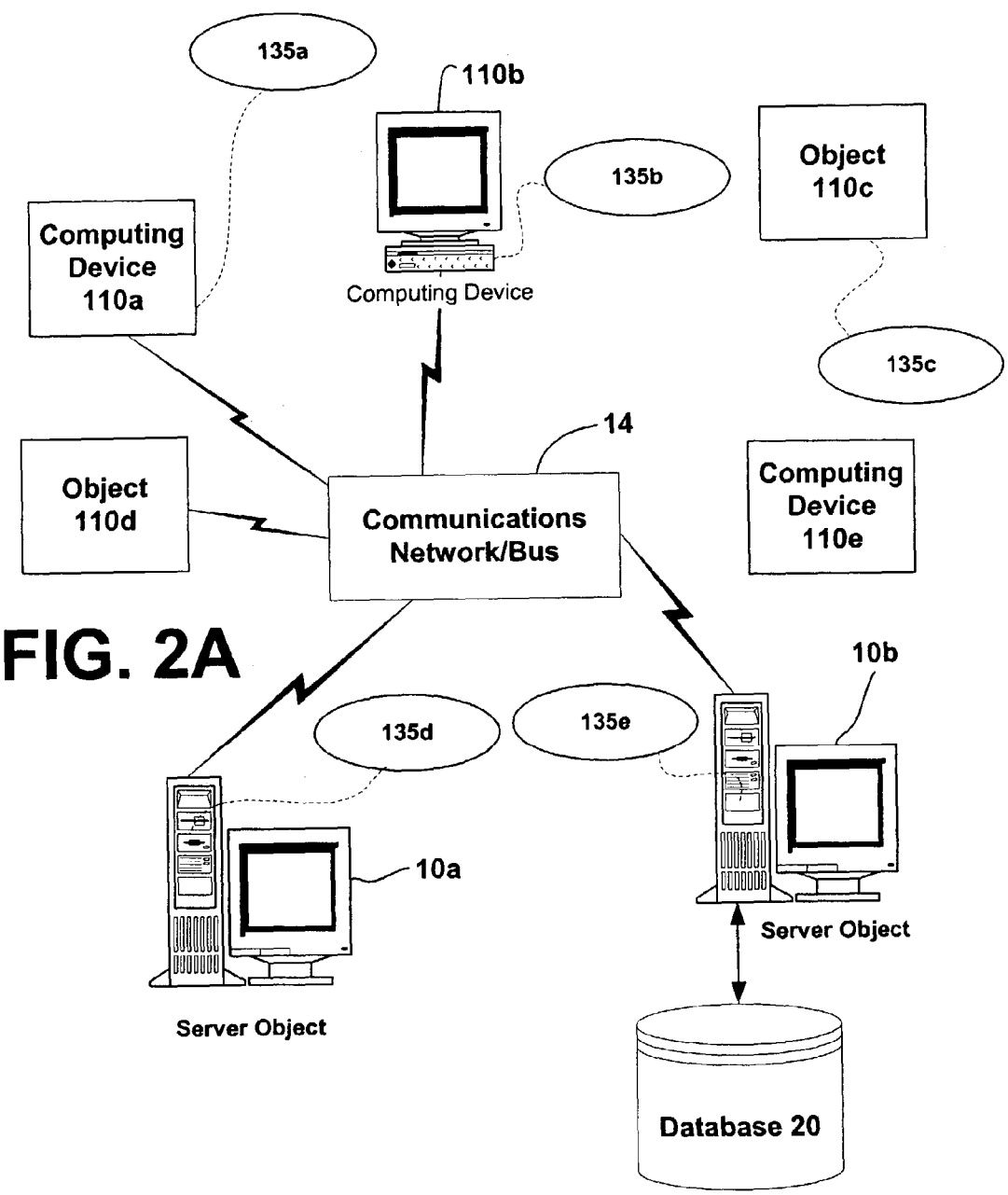
FIG. 2A is a block diagram representing an exemplary network environment having a variety of computing devices in which the present invention may be implemented.

FIG. 2A provides a schematic diagram of an exemplary networked or distributed computing environment. The distributed computing environment comprises computing objects 10a, 10b, etc. and computing objects or devices 110a, 110b, 110c, etc. These objects may comprise programs, methods, data stores, programmable logic, etc. The objects may comprise portions of the same or different devices such as PDAs, televisions, MP3 players, televisions, personal computers, etc. Each object can communicate with another object by way of the communications network 14. This network may itself comprise other computing objects and computing devices that provide services to the system of FIG. 2A. In accordance with an aspect of the invention, each object 10a, 10b, etc. or 110a, 110b, 110c, etc. may contain an application that might make use of an API, or other object, software or hardware, to request use of the encoding/decoding services in accordance with the invention.

In a distributed computing architecture, computers, which may have traditionally been used solely as clients, communicate directly among themselves and can act as both clients and servers, assuming whatever role is most efficient for the network. This reduces the load on servers and allows all of the clients to access resources available on other clients, thereby increasing the capability and efficiency of the entire network. Services that use the encoding/decoding techniques in accordance with the present invention may thus be distributed among clients and servers, acting in a way that is efficient for the entire network.

Distributed computing can help businesses deliver services and capabilities more efficiently across diverse geographic boundaries. Moreover, distributed computing can move data closer to the point where data is consumed acting as a network caching mechanism. Distributed computing also allows computing networks to dynamically work together using intelligent agents. Agents reside on peer computers and communicate various kinds of information back and forth. Agents may also initiate tasks on behalf of other peer systems. For instance, intelligent agents can be used to prioritize tasks on a network, change traffic flow, search for files locally or determine anomalous behavior such as a virus and stop it before it affects the network. All sorts of other services may be contemplated as well. Since data may in practice be physically located in one or more locations, the ability to distribute services that use the encoding/decoding techniques described herein is of great utility in such a system.

It can also be appreciated that an object, such as 110c, may be hosted on another computing device 10a, 10b, etc. or 110a, 110b, etc. Thus, although the physical environment depicted may show the connected devices as computers, such illustration is merely exemplary and the physical environment may alternatively be depicted or described comprising various digital devices such as PDAs, televisions, MP3 players, etc., software objects such as interfaces, COM objects and the like.

There are a variety of systems, components, and network configurations that support distributed computing environments. For example, computing systems may be connected together by wired or wireless systems, by local networks or widely distributed networks. Currently, many of the networks are coupled to the Internet, which provides the infrastructure for widely distributed computing and encompasses many different networks.

In home networking environments, there are at least four disparate network transport media that may each support a unique protocol, such as Power line, data (both wireless and wired), voice (e.g., telephone) and entertainment media. Most home control devices such as light switches and appliances may use power line for connectivity. Data Services may enter the home as broadband (e.g., either DSL or Cable modem) and are accessible within the home using either wireless (e.g., HomeRF or 802.1 lb) or wired (e.g., Home PNA, Cat 5, even power line) connectivity. Voice traffic may enter the home either as wired (e.g., Cat 3) or wireless (e.g., cell phones) and may be distributed within the home using Cat 3 wiring. Entertainment media, or other graphical data, may enter the home either through satellite or cable and is typically distributed in the home using coaxial cable. IEEE 1394 and DVI are also emerging as digital interconnects for clusters of media devices. All of these network environments and others that may emerge as protocol standards may be interconnected to form an intranet that may be connected to the outside world by way of the Internet. In short, a variety of disparate sources exist for the storage and transmission of data, and consequently, moving forward, computing devices will require ways of sharing data, such as data accessed or utilized incident to program objects, which make use of the encoding/decoding techniques in accordance with the present invention.

The Internet commonly refers to the collection of networks and gateways that utilize the, TCP/IP suite of protocols, which are well-known in the art of computer networking. TCP/IP is an acronym for "Transport Control Protocol/Interface Program." The Internet can be described as a system of geographically distributed remote computer networks interconnected by computers executing networking protocols that allow users to interact and share information over the networks. Because of such wide-spread information sharing, remote networks such as the Internet have thus far generally evolved into an open system for which developers can design software applications for performing specialized operations or services, essentially without restriction.

Thus, the network infrastructure enables a host of network topologies such as client/server, peer-to-peer, or hybrid architectures. The "client" is a member of a class or group that uses the services of another class or group to which it is not related. Thus, in computing, a client is a process, i.e., roughly a set of instructions or tasks, that requests a service provided by another program. The client process utilizes the requested service without having to "know" any working details about the other program or the service itself. In a client/server architecture, particularly a networked system, a client is usually a computer that accesses shared network resources provided by another computer, e.g., a server. In the example of FIG. 2A, computers 110a, 110b, etc. can be thought of as clients and computer 10a, 10b, etc. can be thought of as the server where server 10a, 10b, etc. maintains the data that is then replicated in the client computers 110a, 110b, etc., although any computer could be considered a client, a server, or both, depending on the circumstances.

A server is typically a remote computer system accessible over a remote network such as the Internet. The client process may be active in a first computer system, and the server process may be active in a second computer system, communicating with one. another over a communications medium, thus providing distributed functionality and allowing multiple clients to take advantage of the information-gathering capabilities of the server.

Client and server communicate with one another utilizing the finctionality provided by a protocol layer. For example, Hypertext-Transfer Protocol (HTTP) is a common protocol that is used in conjunction with the World Wide Web (WWW). Typically, a computer network address such as a Universal Resource Locator (URL) or an Internet Protocol (IP) address is used to identify the server or client computers to each other. The network address can be referred to as a URL address. For example, communication can be provided over a communications medium. In particular, the client and server may be coupled to one another via TCP/IP connections for high-capacity communication.

Thus, FIG. 2A illustrates an exemplary networked or distributed environment, with a server in communication with client computers via a network/bus, in which the present invention may be employed. In more detail, a number of servers 10a, 10b, etc., are interconnected via a communications network/bus 14, which may be a LAN, WAN, intranet, the Internet, etc., with a number of client or remote computing devices 110a, 110b, 110c, 110d, 110e, etc., such as a portable computer, handheld computer, thin client, networked appliance, or other device, such as a VCR, TV, oven, light, heater and the like in accordance with the present invention. It is thus contemplated that the present invention may apply to any computing device in connection with which it is desirable to implement encoding or decoding of data.

In a network environment in which the communications network/bus 14 is the Internet, for example, the servers 10a, 10b, etc. can be Web servers with which the clients 110a, 110b, 110c, 110d, 110e, etc. communicate via any of a number of known protocols such as HTTP. Servers 10a, 10b, etc. may also serve as clients 110a, 110b, 110c, 110d, 110e, etc., as may be characteristic of a distributed computing environment. Communications may be wired or wireless, where appropriate. Client devices 110a, 110b, 110c, 110d, 110e, etc. may or may not communicate via communications network/bus 14, and may have independent communications associated therewith. For example, in the case of a TV or VCR, there may or may not be a networked aspect to the control thereof. Each client computer 110a, 110b, 110c, 110d, 110e, etc. and server computer 10a, 10b, etc. may be equipped with various application program modules or objects 135 and with connections or access to various types of storage elements or objects, across which files may be stored or to which portion(s) of files may be downloaded or migrated. Any computer 10a, 10b, 110a, 110b, etc. may be responsible for the maintenance and updating of a database 20 or other storage element in accordance with the present invention, such as a database or memory 20 for storing data processed according to the invention. Thus, the present invention can be utilized in a computer network environment having client computers 110a, 110b, etc. that can access and interact with a computer network/bus 14 and server computers 10a, 10b, etc. that may interact with client computers 110a, 110b, etc. and other like devices, and databases 20.

Exemplary Computing Device

Figure 2B:
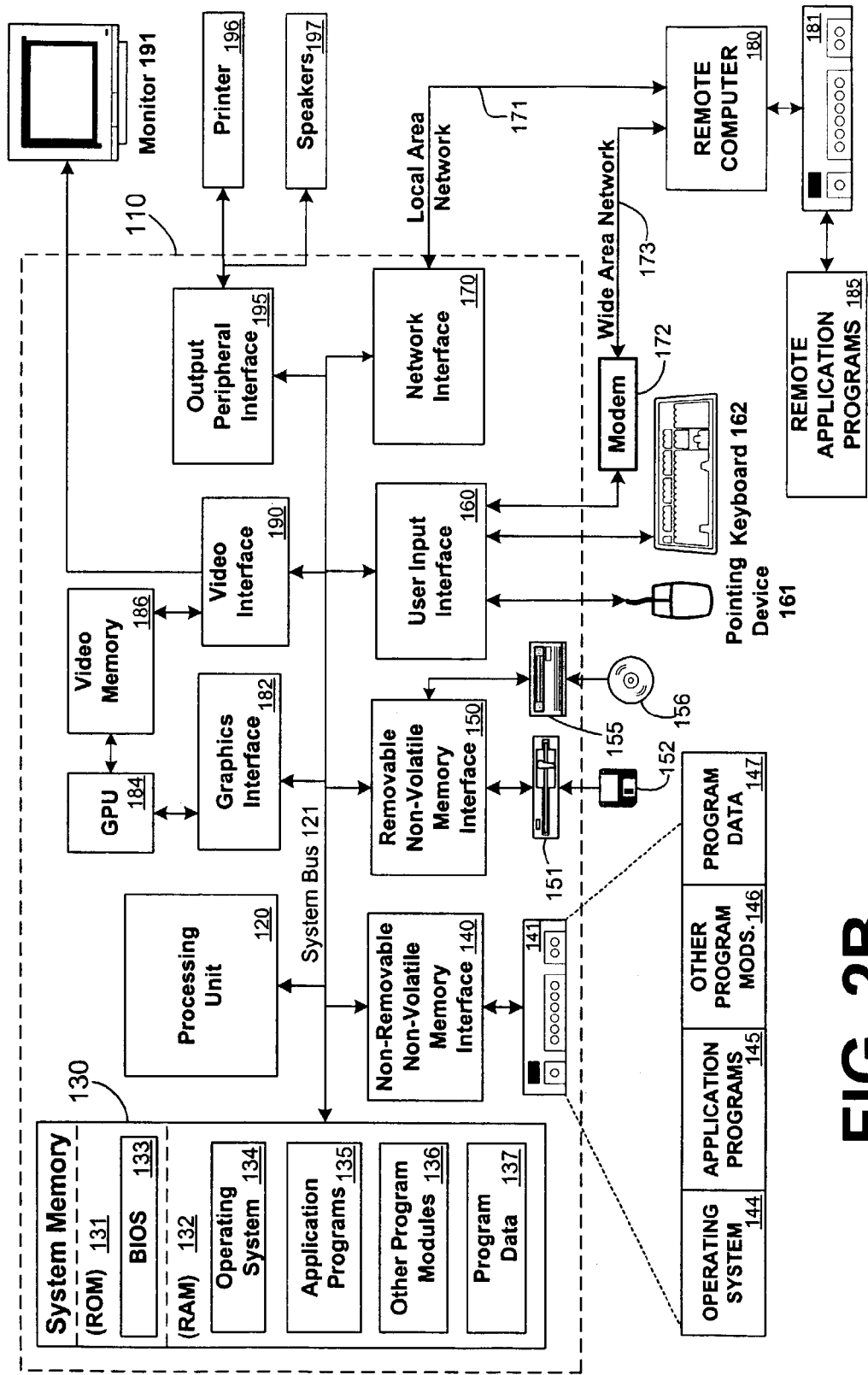
FIG. 2B is a block diagram representing an exemplary non-limiting computing device in which the present invention may be implemented.

FIG. 2B and the following discussion are intended to provide a brief general description of a suitable computing environment in which the invention may be implemented. It should be understood, however, that handheld, portable and other computing devices and computing objects of all kinds are contemplated for use in connection with the present invention. While a general purpose computer is described below, this is but one example, and the present invention may be implemented with a thin client having network/bus interoperability and interaction. Thus, the present invention may be implemented in an environment of networked hosted services in which very little or minimal client resources are implicated, e.g., a networked environment in which the client device serves merely as an interface to the network/bus, such as an object placed in an appliance. In essence, anywhere that data may be stored or from which data may be retrieved is a desirable, or suitable, environment for operation of the techniques for encoding or decoding data in accordance with the invention.

Although not required, the invention can be implemented via an operating system, for use by a developer of services for a device or object, and/or included within application software that operates in connection with encoding or decoding data in accordance with the invention. Software may be described in the general context of computer-executable instructions, such as program modules, being executed by one or more computers, such as client workstations, servers or other devices. Generally, program modules include routines, programs, objects, components, data structures and the like that perform particular tasks or implement particular abstract data types. Typically, the functionality of the program modules may be combined or distributed as desired in various embodiments. Moreover, those skilled in the art will appreciate that the invention may be practiced with other computer system configurations and protocols. Other well known computing systems, environments, and/or configurations that may be suitable for use with the invention include, but are not limited to, personal computers (PCs), automated teller machines, server computers, hand-held or laptop devices, multi-processor systems, microprocessor-based systems, programmable consumer electronics, network PCs, appliances, lights, environmental control elements, minicomputers, mainframe computers and the like. The invention may also be practiced in distributed computing environments where tasks are performed by remote processing devices that are linked through a communications network/bus or other data transmission medium. In a distributed computing environment, program modules may be located in both local and remote computer storage media including memory storage devices, and client nodes may in turn behave as server nodes.

FIG. 2B thus illustrates an example of a suitable computing system environment 100 in which the invention may be implemented, although as made clear above, the computing system environment 100 is only one example of a suitable computing environment and is not intended to suggest any limitation as to the scope of use or functionality of the invention. Neither should the computing environment 100 be interpreted as having any dependency or requirement relating to any one or combination of components illustrated in the exemplary operating environment 100.

With reference to FIG. 2B, an exemplary system for implementing the invention includes a general purpose computing device in the form of a computer 110. Components of computer 110 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus (also known as Mezzanine bus).

Computer 110 typically includes a variety of computer readable media. Computer readable media can be any available media that can be accessed by computer 110 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can accessed by computer 110. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 2B illustrates operating system 134, application programs 135, other program modules 136, and program data 137.

The computer 110 may also include other removable/non-removable, volatile/nonvolatile computer storage media. By way of example only, FIG. 2B illustrates a hard disk drive 141 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156, such as a CD-ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM and the like. The hard disk drive 141 is typically connected to the system bus 121 through a non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 2B provide storage of computer readable instructions, data structures, program modules and other data for the computer 110. In FIG. 2B, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies. A user may enter commands and information into the computer 110 through input devices such as a keyboard 162 and pointing device 161, commonly referred to as a mouse, trackball or touch pad. Other input devices (not shown) may include a microphone, joystick, game pad, satellite dish, scanner, or the like. These and other input devices are often connected to the processing unit 120 through a user input interface 160 that is coupled to the system bus 121, but may be connected by other interface and bus structures, such as a parallel port, game port or a universal serial bus (USB). A graphics interface 182, such as Northbridge, may also be connected to the system bus 121. Northbridge is a chipset that communicates with the CPU, or host processing unit 120, and assumes responsibility for accelerated graphics port (AGP) communications. One or more graphics processing units (GPUs) 184 may communicate with graphics interface 182. In this regard, GPUs 184 generally include on-chip memory storage, such as register storage and GPUs 184 communicate with a video memory 186, wherein the application variables of the invention may have impact. GPUs 184, however, are but one example of a coprocessor and thus a variety of coprocessing devices may be included in computer 110, and may include a variety of procedural shaders, such as pixel and vertex shaders. A monitor 191 or other type of display device is also connected to the system bus 121 via an interface, such as a video interface 190, which may in turn communicate with video memory 186. In addition to monitor 191, computers may also include other peripheral output devices such as speakers 197 and printer 196, which may be connected through an output peripheral interface 195.

The computer 110 may operate in a networked or distributed environment using logical connections to one or more remote computers, such as a remote computer 180. The remote computer 180 may be a personal computer, a server, a router, a network PC, a peer device or other common network node, and typically includes many or all of the elements described above relative to the computer 110, although only a memory storage device 181 has been illustrated in FIG. 2B. The logical connections depicted in FIG. 2B include a local area network (LAN) 171 and a wide area network (WAN) 173, but may also include other networks/buses. Such networking environments are commonplace in homes, offices, enterprise-wide computer networks, intranets and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 2B illustrates remote application programs 185 as residing on memory device 181. It will be appreciated that the network connections shown are exemplary and other means of establishing a communications link between the computers may be used.

Exemplary Distributed Computing Frameworks or Architectures

Various distributed computing frameworks have been and are being developed in light of the convergence of personal computing and the Internet. Individuals and business users alike are provided with a seamlessly interoperable and Web-enabled interface for applications and computing devices, making computing activities increasingly Web browser or network-oriented.

For example, MICROSOFT®'s.NET platform includes servers, building-block services, such as Web-based data storage and downloadable device software. Generally speaking, the .NET platform provides (1) the ability to make the entire range of computing devices work together and to have user information automatically updated and synchronized on all of them, (2) increased interactive capability for Web sites, enabled by greater use of XML rather than HTML, (3) online services that feature customized access and delivery of products and services to the user from a central starting point for the management of various applications, such as e-mail, for example, or software, such as Office .NET, (4) centralized data storage, which will increase efficiency and ease of access to information, as well as synchronization of information among users and devices, (5) the ability to integrate various communications media, such as e-mail, faxes, and telephones, (6) for developers, the ability to create reusable modules, thereby increasing productivity and reducing the number of programming errors and (7) many other cross-platform integration features as well.

While some exemplary embodiments herein are described in connection with software residing on a computing device, one or more portions of the invention may also be implemented via an operating system, application programming interface (API) or a "middle man" object, hardware, firmware, etc., such that the methods may be included in, supported in or accessed via all of .NET's languages and services, and in other distributed computing frameworks as well.

Exemplary Controller Architectures

While the above description has generally illustrated some exemplary computing environments for operation of the invention, it should be noted that the invention may be uniquely suited to, or advantageously practiced in, various existing controller architectures. It is contemplated herein that one scenario for practically utilizing the invention for large-scale deployment includes the manufacture of custom silicon chip(s), programmable gate array(s) or any computing device capable of integrating network communications, data disk controllers and Reed-Solomon algorithms into a small package. Such implementations advantageously forego the need for a general-purpose processing element, potentially improving processing speed and performance, and decreasing the cost of implementing the invention.

Systems and Methods for Encoding and Decoding

As mentioned above, the present invention provides systems and methods for simplifying the construction of Reed-Solomon based erasure codes, or coding matrices, over $GF(2^n)$ in connection with the restricted case when the number of errors to be corrected is less than or equal to three. In application, the invention ensures that the specific matrix of three rows of a Vandermonde matrix over $GF(2^n)$ have the property that all minors are invertible, leading to a slightly larger range of values for coding matrices than is otherwise known.

In more detail, a Vandermonde matrix is a matrix having columns of consecutive powers of distinct elements of the ground field of the working domain. In a standard Vandermonde matrix, the first row contains the zero'th powers, the second row the first powers, the third row the second powers, etc. Invertibility follows from computation of the determinant, which (up to sign) is equal to the product of the differences of the elements used to generate the matrix. It should be noted that over $GF(2^n)$, sign is irrelevant since addition and subtraction are identical over fields of characteristic 2. If a column begins with a higher power of an element, the determinant is multiplied by that value (and is still non-zero, if the element is non-zero). Such a matrix is called an extended Vandermonde matrix.

For example, let x be a generator of the multiplicative group of the finite field. The elements forming the basis of the Vandermonde matrix of the invention are $x^0$(i.e., 1), $x^1$, and $x^2$, as illustrated by the exemplary coding matrix of FIG. 3. When an arbitrary m by m submatrix of the resulting coding matrix is taken, the columns from the identity-portion of the matrix can be ignored when computing the determinant, leaving an arbitrary 0 by 0, 1 by 1, 2 by 2, or 3 by 3 minor of the Vandermonde section.

In all cases, the minor is a (possibly extended, in the case of 2 by 2) transposed Vandermonde matrix, and hence has non-zero determinant, because $x^i$ differs from $x^j$ and $x^{2i}$ differs from $x^{2j}$ for $0<=i<j<2^n-1$. The difficult case is showing that $x^{2i}$ and $x^{2j}$ are distinct; this is true because x is a generator of the multiplicative group, and thus $x^{2(i-j)}$ is equal to 1 only when $2(i-j)$ is a multiple of the order of the multiplicative group. For $GF(2^n)$, that order is $2^n-1$; since this is odd, i needs to be congruent to j modulo $2^n-1$ to obtain unity. When extended to finite fields of other characteristics, since 2 is a factor of the order of the multiplicative group, m is restricted to be less than half the order of the multiplicative group.

By performing multiplication using logarithms, the coding matrix becomes quite simple: the logarithms in the encoding columns are all 0's, the consecutive integers starting from 0, and integers going up by twos starting from 0; when updating data element i by exclusive or with data d, the update to check value j is to x or by antilog(log(d)+j*i). Compared to conventional techniques, the cost of looking up the coding matrix entry is saved; while this lookup can be trivial, in a small microcontroller or the like, the storage cost may not be trivial.

For reconstruction, it is noted that the first check function is parity, so correcting one erasure is very simple. Correcting two or more erasures requires inverting the minor indicating by what to multiply the check elements. Then, the other data element multipliers are linear combinations of the corresponding check element multipliers and the elements of the coding matrix, which are easy to compute.

In application, when building a large array of disks, it is desirable to mask any hardware failures using erasure codes. Typical mean-time-to-failure of disks is about 50 years. Accordingly, if the time to reconstruct the data on a failed disk to a spare disk is less than a day, the expected time until a cluster of 255 data disks with three correction disks experiences a triple failure in the same day is roughly one million years. Thus, additional correction disks are unnecessary for ordinary operation of a disk cluster. Without the invention, however, 254 data disks would be the limitation, and construction of the matrices and application of the matrices becomes more expensive.

For a non-limiting implementation of the invention, consider GF(256). Addition operators can be implemented as byte-wide exclusive-or gates, or other means known in the art. Multiplication can be performed using a table of logarithms and a table of antilogarithms, as illustrated in FIG. 4. The logarithm table maps bytes (representing polynomials of degree at most 7) to their logarithm, i.e., the power to which some generator must be raised to produce the polynomial. The logarithms for 0 to 255 are in the range 0 to 254, except for the logarithm of 0, which can be represented by −255. The results of constructing an antilog table with indices which allow the sum of any pair of logarithms are as follows: −510 up to −1 all map to 0, 0 through 254 are as expected, and 255 to 508 repeat the antilogs from 0 to 254.

With such an antilog table, multiplication of two elements of GF(256) can be performed by looking up the logarithms, adding them, and then taking the antilog. For the coding matrix generated in accordance with the invention, the contribution to the sum for the i'th correction function when applied to the j'th data element may be computed by adding i times j to the logarithm of the data element, taking the antilog, and adding the result to the sum.

In researching the construction of a large and reliable array of disks, it was observed that being able to recover from up to three disk failures (erasures) would provide reliability of roughly one million years, for an array of roughly 250 disks. In this regard, the invention is an optimization for the case of a maximum of three disk failures, and provides methods for constructing a Reed-Solomon encoding matrices which are simpler and more regular than existing techniques, and allow for the coding to be applied to more disks than previous techniques.

There are multiple ways of implementing the present invention, e.g., an appropriate API, tool kit, driver code, operating system, standalone or downloadable software object, etc. which enables applications and services to use the encoding/decoding methods of the invention. The invention contemplates the use of the invention from the standpoint of an API (or other software object), as well as from a software or hardware object that communicates in connection with encoding/decoding of data. Thus, various implementations of the invention described herein have aspects that are wholly in hardware, partly in hardware and partly in software, as well as in software.

As mentioned above, while exemplary embodiments of the present invention have been described in connection with various computing devices and network architectures, the underlying concepts may be applied to any computing device or system in which it is desirable to implement encoding/decoding of data. Thus, the techniques for encoding/decoding data in accordance with the present invention may be applied to a variety of applications and devices. For instance, the algorithm(s) and hardware implementations of the invention may be applied to the operating system of a computing device, provided as a separate object on the device, as part of another object, as a downloadable object from a server, as a "middle man" between a device or object and the network, as a distributed object, as hardware, in memory, a combination of any of the foregoing, etc. While exemplary programming languages, names and examples are chosen herein as representative of various choices, these languages, names and examples are not intended to be limiting. One of ordinary skill in the art will appreciate that there are numerous ways of providing object code that achieves the same, similar or equivalent functionality achieved by the various embodiments of the invention.

As mentioned, the various techniques described herein may be implemented in connection with hardware or software or, where appropriate, with a combination of both. Thus, the methods and apparatus of the present invention, or certain aspects or portions thereof, may take the form of program code (i.e., instructions) embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. In the case of program code execution on programmable computers, the computing device will generally include a processor, a storage medium readable by the processor (including volatile and non-volatile memory and/or storage elements), at least one input device, and at least one output device. One or more programs that may utilize the encoding/decoding techniques of the present invention, e.g., through the use of a data processing API or the like, are preferably implemented in a high level procedural or object oriented programming language to communicate with a computer system. However, the program(s) can be implemented in assembly or machine language, if desired. In any case, the language may be a compiled or interpreted language, and combined with hardware implementations.

The methods and apparatus of the present invention may also be practiced via communications embodied in the form of program code that is transmitted over some transmission medium, such as over electrical wiring or cabling, through fiber optics, or via any other form of transmission, wherein, when the program code is received and loaded into and executed by a machine, such as an EPROM, a gate array, a programmable logic device (PLD), a client computer, a video recorder or the like, or a receiving machine having the signal processing capabilities as described in exemplary embodiments above becomes an apparatus for practicing the invention. When implemented on a general-purpose processor, the program code combines with the processor to provide a unique apparatus that operates to invoke the functionality of the present invention. Additionally, any storage techniques used in connection with the present invention may invariably be a combination of hardware and software.

While the present invention has been described in connection with the preferred embodiments of the various figures, it is to be understood that other similar embodiments may be used or modifications and additions may be made to the described embodiment for performing the same function of the present invention without deviating therefrom. For example, while exemplary network environments of the invention are described in the context of a networked environment, such as a peer to peer networked environment, one skilled in the art will recognize that the present invention is not limited thereto, and that the methods, as described in the present application may apply to any computing device or environment, such as a gaming console, handheld computer, portable computer, etc., whether wired or wireless, and may be applied to any number of such computing devices connected via a communications network, and interacting across the network. Furthermore, it should be emphasized that a variety of computer platforms, including handheld device operating systems and other application specific operating systems are contemplated, especially as the number of wireless networked devices continues to proliferate. Still further, the present invention may be implemented in or across a plurality of processing chips or devices, and storage may similarly be effected across a plurality of devices. Therefore, the present invention should not be limited to any single embodiment, but rather should be construed in breadth and scope in accordance with the appended claims.

What is claimed is:

1. A method for efficient transmission of a data field when, prior to transmission, the data field includes a number of failures less than or equal to three, comprising:
generating by at least one computer processor data representing a Vandermonde matrix over $GF(2^n)$ by:
generating an identity matrix portion;
generating an erasure coding portion comprising data values corresponding to a set of three rows having a property that each minor of the set of three rows is invertible; and
computing a determinant of a submatrix of the erasure coding portion, wherein said computing includes ignoring columns from the identity matrix portion, wherein said computing results in one of a 0 by 0, 1 by 1, 2 by 2 and 3 by 3 minor of the erasure coding portion remaining;
using by the at least one computer processor the generated data representing the Vandermonde matrix to correct the failures in the data field; and
in response to correcting the failures in the data field, transmitting by the at least one computer processor the data field to a recipient, the transmitting being made more efficient by correcting the failures in the data field prior to performing the transmitting.

2. The method according to claim 1, wherein each minor is a transposed extended Vandermonde matrix and has a non-zero determinant.

3. The method according to claim 1, wherein said submatrix of the erasure coding portion is an arbitrary m by m submatrix.

4. The method according to claim 1, wherein said generating steps increase the range of values for coding matrices.

5. A computing system operable to efficiently transmitting a data field when, prior to transmission, the data field includes a number of failures less than or equal to three, comprising:
a processor; and
a memory having stored therein computer executable instructions for performing steps comprising:
generating data representing a Vandermonde matrix over $GF(2^n)$ by:
generating an identity matrix portion;
generating an erasure coding portion comprising data values corresponding to a set of three rows having a property that each minor of the set of three rows is invertible; and
computing a determinant of a submatrix of the erasure coding portion, wherein said computing includes ignoring columns from the identity matrix portion, wherein said computing results in one of a 0 by 0, 1 by 1, 2 by 2 and 3 by 3 minor of the erasure coding portion remaining;
using the generated data representing the Vandermonde matrix to correct the failures in the data field; and
in response to correcting the failures in the data field, transmitting by the at least one computer processor the data field to a recipient, the transmitting being made more efficient by correcting the failures in the data field prior to performing the transmitting.

6. A computing system according to claim 5, wherein each minor is a transposed extended Vandermonde matrix and has a non-zero determinant.

7. A computing system according to claim 5, wherein said submatrix of the erasure coding portion is an arbitrary m by m submatrix.

8. A computing system according to claim 5, wherein generating an erasure coding portion increases the range of values for a coding matrice.

9. A computer readable storage medium readable by a machine and having stored thereon computer executable instructions being executable by the machine to perform a method of efficiently transmitting a data field when, prior to transmission, the data field includes a number of failures less than or equal to three, the computer executable instructions comprising:
generating data representing a Vandermonde matrix over $GF(2^n)$ by:
generating an identity matrix portion;
generating an erasure coding portion comprising data values corresponding to a set of three rows having a property that each minor of the set of three rows is invertible; and
computing a determinant of a submatrix of the erasure coding portion, wherein said computing includes ignoring columns from the identity matrix portion, wherein said computing results in one of a 0 by 0, 1 by 1, 2 by 2 and 3 by 3 minor of the erasure coding portion remaining;
using the generated data representing the Vandermonde matrix to correct the failures in the data field; and
in response to correcting the failures in the data field, transmitting by the at least one computer processor the data field to a recipient, the transmitting being made more efficient by correcting the failures in the data field prior to performing the transmitting.

10. The computer readable storage medium of claim 9, wherein each minor is a transposed extended Vandermonde matrix and has a non-zero determinant.

11. The computer readable storage medium of claim 9, wherein said submatrix of the erasure coding portion is an arbitrary m by m submatrix.

12. The computer readable storage medium according to claim 9, wherein said generating steps increase the range of values for coding matrices.

* * * * *